United States Patent [19]

Inada et al.

[11] Patent Number: 5,607,900

[45] Date of Patent: Mar. 4, 1997

[54] PROCESS FOR CLEANING A SURFACE OF THIN FILM OF OXIDE SUPERCONDUCTOR

[75] Inventors: Hiroshi Inada; Takao Nakamura; Michitomo Iiyama; So Tanaka, all of Osaka, Japan

[73] Assignee: Sumitomo Electric Industries, Ltd., Osaka, Japan

[21] Appl. No.: 551,702

[22] Filed: Nov. 1, 1995

Related U.S. Application Data

[63] Continuation of Ser. No. 261,205, Jun. 15, 1994, abandoned, which is a continuation of Ser. No. 858,151, Mar. 27, 1992, abandoned.

[30] Foreign Application Priority Data

| Mar. 28, 1991 | [JP] | Japan | 3-089618 |
| Mar. 28, 1991 | [JP] | Japan | 3-089619 |
| Jul. 1, 1991 | [JP] | Japan | 3-186927 |

[51] Int. Cl.$^6$ ............................ B05D 5/12; B08B 5/04
[52] U.S. Cl. ...................... 505/500; 505/473; 505/742; 427/62; 134/21
[58] Field of Search ........................ 505/500, 742, 505/473, 329; 134/21; 427/62, 63, 419.3, 372.2

[56] References Cited

U.S. PATENT DOCUMENTS 5,061,687  10/1991  Takada et al. ........................ 505/1

OTHER PUBLICATIONS

Sobolewski et al, "Cleaning of YBa2Cu3O7–x by Thermal Oxidation Treatments", American Vacuum Society Series 9, Conference Proceedings No. 200, 1989, pp. 197–204.

Watanabe et al, "XPS measurement of YBa2Cu3Oy compounds heated at various temperatures", Japanese Journal of Applied Physics, Part 2, Letters, vol. 27, No. 5, May 1988, pp. 783–785.

Yoshitake et al, "Effect of oxygen plasma annealing on superconducting properties of B12(Sr,Ca) 3Cu2Ox and YBa2Cu3O7–d thin films" Applied Physics Letters, vol. 56, No. 6, Feb. 5, 1990, pp. 575–577.

Patent Abstracts of Japan, vol. 014, No. 374, Aug. 13, 1990/JP–A–2137277 (Matsushita) May 25, 1990.

Tanaka et al, "Low energy ion scattering spectroscopy observations . . . " Applied Physics Letters, vol. 59, No. 27, Dec. 30, 1991, pp. 3637–3639.

Ohara et al., "Atmospheric Deterioration of clean surface of epitaxial (001)–YBaCuO films . . . ", Jap. Journal of Applied Physics, vol. 30, No. 12B Dec. 1991, pp. 2085–2087.

Tanaka et al, "Surface Analysis of C–axis oriented YBaCuO thin films by QMS, XPS, and LEED . . . ", Jap. Journal of Applied Physics, vol. 30, No. 88, Aug. 1991, pp. 1458–1461.

Kiryakov et al, "Investigation of the Gas Evolution from High–Tc Superconductivity Ceramic Y—Ba—Cu—O Heat Treated in Vacuum", Superconductivity: Physics, Chemistry, Technology vol. 3, No. 6, pt. 1 pp. 1057–1064, Jun. 1990.

*Primary Examiner*—Roy V. King
*Attorney, Agent, or Firm*—Kerkam, Stowell, Kondracki & Clarke, P.C.; John C. Kerins

[57] ABSTRACT

A process for removing contaminants from a surface of a thin film of oxide superconductor deposited on a substrate. The thin film of oxide superconductor is heat-treated in ultra-high vacuum at a temperature which is within a range of –100° C. to +100° C. of the temperature at which oxygen enter into the oxide superconductor.

The process is used for removing photo-resist from a surface of thin film of oxide superconductor and for producing a layered structure containing at least one thin film of oxide superconductor such as $Y_1Ba_2Cu_3O_{7-x}$ having a contaminated surface. On the cleaned surface, another thin film of oxide superconductor or non-superconductor is deposited. The resulting structure of layered thin films is used for fabricating superconducting transistor, Josephson junctions, superconducting circuits or the like.

17 Claims, 1 Drawing Sheet

PROCESS FOR CLEANING A SURFACE OF THIN FILM OF OXIDE SUPERCONDUCTOR

This is a continuation of application Ser. No. 08/261,205, filed Jun. 15, 1994, now abandoned, which is a continuation of application Ser. No. 07/858,151, filed Mar. 27, 1992, now abandoned.

BACKGROUND OF THE INVENTION

1. Field of the Invention

The present invention relates to a process for cleaning a surface of a thin film of oxide superconductor.

The process according to the present invention is used for preparing a layered structure containing at least one thin film of oxide superconductor, more particularly, for depositing more than two thin films of oxide superconductor each possessing a different crystal orientation successively on a substrate and for depositing, on a thin film of oxide superconductor, another thin film of different material.

The process according to the present invention is used also for removing photo-resist from a thin film of oxide superconductor.

2. Description of the Related Art

Oxide superconductors are expected to be used in a variety of applications due to their higher critical temperatures than conventional metal superconductors. In fact, Y—Ba—Cu—O oxide superconductor possesses the critical temperature above 80 K. and Bi—Sr—Ca—Cu—O and Tl—Ba—Ca—Cu—O oxide superconductors possesses that of above 100 K.

These oxide sutterconductors, however, possess crystal anisotropy in their superconducting properties. In fact, the highest critical current density is observed in a direction which is perpendicular to c-axis of their crystal. From this fact, the direction of crystal must be considered in actual utilization of these oxide superconductors.

When the oxide superconductors are used in superconducting electronics applications such as superconducting devices or integrated superconducting circuits, it is indispensable to prepare at least one thin film of the oxide superconductor and to laminate a plurality of thin films. The problem of crystal anisotropy becomes much server in such superconducting devices or integrated superconducting circuits. For instance, in order to realize high-performance superconducting devices or integrated superconducting circuits, it is requested to prepare two kinds of superconducting wiring lines: one part in which electric current flows in parallel with a surface of substrate and another part in which electric current flows perpendicularly to the surface of substrate. For example, in superconducting electrodes, current flows in parallel with the surface of substrate while, in interlayer connecting superconducting wiring lines which connect layers stratified on the substrate, current flows perpendicularly to the surface of substrate. Therefor, when oxide superconductor is used in high-performance superconducting devices or integrated superconducting circuits, it is requested to deposit both of c-axis orientated thin film of oxide superconductor in which the critical current density along the direction which is in parallel with the surface of substrate is higher than the other directions and of a-axis (or b-axis) orientated thin film of oxide superconductor in which the critical current density along the direction which is perpendicular to the surface of substrate is higher than the c-axis orientated thin film on a common surface of a substrate. Hereinafter, only a-axis oriented thin film is referred, since electric current flows equally along the direction which is perpendicular to the surface of substrate in a-axis orientated thin film and in b-axis orientated thin film.

In the multi-layered structures for the superconducting devices or integrated superconducting circuits, two layers of a c-axis oriented thin film of oxide superconductor and of an a-axis oriented thin film of oxide superconductor must be deposited successively. Crystal orientation of the thin film of oxide superconductor can be controlled by selecting or adjusting film-forming temperature which is determined by substrate temperature. In fact, the a-axis oriented thin film can be realized at a substrate temperature which is lower by about 50° to 100° C. than a substrate temperature at which the c-axis oriented thin film grows.

In a superconducting junction of so-called Josephson Junction realized with oxide superconductor, it is requested to deposit a bottom superconductor layer, an intermediate thin film of non-superconductor and a top superconductor layer on a substrate successively in this order.

Josephson element is a two-terminals element, so that a logical circuit consisting of Josephson elements alone becomes complicated. In order to overcome this demerit of complexity, a variety of ideas of three-terminals elements are proposed. In the superconductor transistors consisting of superconductor and semiconductor which is a typical three-terminals element, it is also required to combine a thin film of semiconductor with a thin film of oxide superconductor and hence successive deposition of thin films each made of different material is required.

In these superconducting elements, a superconducting current passes through a thin film of non-superconductor sandwiched between two adjacent layers of superconductors positioned close to each other. A distance between the two superconductors is determined by the coherence length of superconductor. In the case of oxide superconductor, the distance between two superconductors must be several nanometer because its coherence length is very short.

On the other hand, from a point of view as performance of the superconducting devices, all thin films in the superconducting device must have high crystallinity, in other words, these thin films are preferably made of a single crystal or polycrystal having crystal orientation which is similar to single crystal. When the superconducting device has thin film(s) made of polycrystal whose crystal orientation is not well-ordered or has amorphous thin film(s), high-performance of the superconducting devices can not be expected and hence function thereof become unstable.

When more than two thin films are deposited successively on a common substrate, it is usual practice to subject a surface of a bottom superconductor layer to cleaning operation before a top superconductor layer is deposited, otherwise electrical continuity between the bottom superconductor layer and the top superconductor layer is spoiled due to contaminants adsorbed on a surface of the bottom superconductor layer or undesirable oxides produced on the surface. Discontinuity of two layers result in formation of an undesirable junction between two layers. Superconducting devices or integrated superconducting circuits having such undesirable junction do not show desired performance and sometimes do not work.

In particular, the surface condition of the bottom superconductor layer should be considered carefully because the coherence length of oxide superconductors is very short. Still more, oxygen of oxide superconductors is rather unstable and easily escape out of the thin film. Excessive oxygen deficient result in deterioration of superconducting properties and, in the worst case, loss of superconductivity.

Therefore, the surface of bottom superconductor layer must be clean and also must have well-ordered crystallinity or superconducting property.

In the field of semiconductor industries, surfaces are cleaned with ultra-pure water, by chemical washing, dry or wet etching or the like. In the case of oxide superconductors, however, these clearing technique can not be used due to high reactivity of oxide superconductors. If the surface of thin film of oxide superconductor is treated by these known techniques, undesirable reaction occur on the surface, resulting in that cleanness of the surface become worse and crystallinity and superconducting property are lost.

It is also known to deposit the top superconductor layer, just after the bottom superconductor layer of oxide superconductor has been deposited, in an identical chamber. This technique, however, requires a big chamber and materials to be used for the top superconductor layer are limited.

Therefore, an object of the present invention is to solve the problems and to provide an improved process for preparing a layered structure containing at least one thin film of oxide superconductor without deteriorating superconducting properties of the thin film of oxide superconductor.

Another object of the present invention is to provide an improved process for depositing more than two thin films of oxide superconductor each possessing a different crystal orientation successively on a substrate.

Still another object of the present invention is to provide an improved process for depositing, on a thin film of oxide superconductor, another thin film of different material.

The process according to the present invention is applicable also to remove photo-resist residue which is remained on a thin film of oxide superconductor after pattering operation.

Namely, pattering of a thin film of oxide superconductor can be effected by a variety of techniques. The most popular pattering technique is to protect a predetermined surface area on the thin film of oxide superconductor with photo-resist followed by etching. In the case of pattering of oxide superconductors which are chemically active, wet-etching is not suitable and hence dry-etching such as reactive ion etching, electron beam etching or argon ion milling is used.

Generally, pattering of thin films with photo-resist is carried out as following. At first, a surface of the thin film is cleaned and then photo-resist is coated thereon. The photo-resist is cured by pre-baking so that the photo-resist is fix to the thin film. The pre-baked photo-resist is irradiated with light through a mask. After development, the irradiated photo-resist is subject to post-baking and then is etched. Finally, remaining photo-resist is removed by wet-treatment with photo-resist remover or oxidizing reagent to clean the surface of the thin film.

Pattering of thin film of oxide superconductor is carried out almost same sequence as above. In the case of thin film of oxide superconductor, however, serious deterioration of superconductivity is often observed after the pattering. The present inventors found such a fact that such deterioration of superconductivity of the thin film is caused by chemical reaction during removal of the photo-resist. In fact, because of relatively high reactivity, the oxide superconductor react with liquid photo-resist remover or oxidizing reagent at the removing stage of photo-resist, resulting in that a surface of the thin film is roughened and that composition of oxide superconductor is changed. Another thin film deposited on such deteriorated thin film does not show desired superconducting properties and hence it is difficult to obtain a layered structure of high-performance.

It is also known to remove photo-resist by dry-process so-called "ashing" technique in which photo-resist is burnt in oxygen plasma. This ashing technique, however, reduce oxide superconductor during burning of photo-resist, resulting in that oxygen in oxide superconductor is lost. Oxygen-deficient oxide superconductor deviated from desired stoichiometry and lose sharply the superconductivity and often become non-superconductor.

At the today's level of pattering technology, use of photo-resist is indispensable. This situation is same in the thin film of oxide superconductor.

Therefore, still another object of the present invention is to solve the problems and to provide a process for removing photo-resist residue remained on a thin film of oxide superconductor.

SUMMARY OF THE INVENTION

The present invention provide a process for removing contaminants from a surface of a thin film of oxide superconductor deposited on a substrate, characterized in that the thin film of oxide superconductor is heat-treated in ultra-high vacuum at a temperature which is within a range of −100° C. to +100° C. of the temperature at which oxygen enter into the oxide superconductor.

An essence of the process according to the present invention resides in that a surface of oxide superconductor is cleaned by heat-treatment in ultra-high vacuum.

The heat-treatment is carried out preferably in ultra-high vacuum of lower than $1\times10^{-9}$ Torr. Advantage of the present invention can not be expected at a vacuum of higher than $1\times10^{-9}$ Torr.

The temperature at which oxygen enter into the oxide superconductor is known for respective oxides. For example, the heat-treatment is effected at a heating temperature between 350° and 400° C. for a thin film of $Y_1Ba_2Cu_3O_{7-x}$. If the heating temperature is not higher than 350° C., contaminants on the surface of thin film oxide superconductor can not be removed and, if the heating temperature exceed 400° C. oxygen escape out of the thin film of oxide superconductor and is lost.

The substrate is preferably a single crystal of oxide such as $MgO$, $StTiO_3$, $PrGaO_3$ or the like.

The thin film of oxide superconductor can be a bottom superconductor layer which is deposited directly on a surface of the substrate. This bottom superconductor layer can be a thin film of oxide superconductor such as a c-axis oriented thin film of $Y_1Ba_2Cu_3O_{7-x}$.

The process according to the present invention is applicable to any known oxide superconductors and is advantageously applicable to Y—Ba—Cu—O oxide superconductor. Bi—Sr—Ca—Cu—O oxide superconductor and Tl—Ba—Ca—Cu—O oxide superconductor which have the most attractive properties including their high critical temperatures.

The heat-treatment is effected just before a top superconductor layer is deposited on the bottom superconductor layer so that contaminants such as hydrocarbons or metal carbides adsorbed or deposited on the surface of the bottom superconductor layer are removed by the heat-treatment. Still more, local surface disorder of crystallinity in the bottom superconducting layer is repaired and enough oxygen is sustained during the heat-treatment, so that superconducting property is improved.

The contaminants may be photo-resist residues remained on the surface of thin film of oxide superconductor and/or those produced when the thin film of oxide superconductor is exposed to air.

In a preferred first embodiment of the present invention, the process according to the present invention is used for depositing more than two thin films of oxide superconductor each possessing a different crystal orientation successively on a substrate.

In a preferred second embodiment of the present invention, the process according to the present invention is used for depositing, on a thin film of oxide superconductor, another thin film of different material.

In a preferred third embodiment of the present invention, the process according to the present invention is used for removing photoresist residue from a thin film of oxide superconductor.

First Embodiment

In the first embodiment of the present invention, a top superconductor layer may be made of the same material as or different material from a bottom superconductor layer. The bottom and top superconductor layers can be a c-axis and an a-axis oriented thin films of $Y_1Ba_2Cu_3O_{7-x}$ respectively.

Namely, in the first embodiment, the present invention provides a process for depositing a first thin film of an oxide superconductor and a second thin film of oxide superconductor successively, crystal orientation of the first thin film being different from that of the second thin film, and the first thin film having a contaminated surface, characterized in that the first thin film is heat-treated in ultra-high vacuum at a temperature which is within a range of $-100°$ C. to $+100°$ C. of the temperature at which oxygen enter into the oxide superconductor and then the second thin film is deposited on the first thin film of an oxide superconductor The first embodiment of the present invention is applicable for laminating or stratifying thin films of oxide superconductor each having a different crystal orientation successively and, more particularly, is advantageously applicable for depositing an a-axis oriented thin film of oxide superconductor on a c-axis oriented thin film of oxide superconductor.

Second Embodiment

In the second embodiment of the present invention, the present invention provides a process for depositing, on a first thin film of oxide superconductor whose surface is contaminated, a second thin film made of different material from the oxide superconductor, characterized in that the first thin film of oxide superconductor is heat-treated in ultra-high vacuum at a temperature which is within a range of $-100°$ C. to $+100°$ C. of the temperature at which oxygen enter into the oxide superconductor before the second thin film is deposited. In this case, the second thin film can be made of non-superconductor, for example insulator such as MgO or metal such as Ag. A third thin film of oxide superconductor or a top superconducting layer can be deposit additionally on the second thin film.

The second embodiment of the process according to the present invention is applicable for stratifying a thin film of insulator or ordinary conductor on a thin film of oxide superconductor for fabricating superconducting devices.

In both embodiments, the process according to the present invention is applicable, for example, to such a thin film of oxide superconductor which is exposed to air and hence whose surface is deteriorated, in order to clean the surface before another thin film of different material or the top superconductor layer having a different crystal orientation is deposited thereon, so that more than two thin film layers each having a different crystal orientation or a combination of a thin film of oxide superconductor and a non-superconductor can be deposited in different film forming apparatuses independently at their optimum conditions and hence the resulting layered thin films show an improved superconducting properties.

The stratified thin films obtained by these embodiments show improved crystallinity, continuity and lattice matching at an interface which are requested for realizing superconducting elements or integrated superconducting circuits from which high-performance superconducting devices are fabricated.

Third Embodiment

In the third embodiment of the present invention, the present invention provides a process for removing photoresist from a thin film of oxide superconductor, characterized in that the thin film of oxide superconductor is heat-treated in ultra-high vacuum at a temperature which is within a range of $-100°$ C. to $+100°$ C. of the temperature at which oxygen enter into the oxide superconductor.

The process according to the present invention used in the third embodiment is a kind of ashing technology. The process, however, permits to remove photo-resist completely without deteriorating the thin film of oxide superconductor by selecting certain conditions including heating temperature and atmosphere. In fact, by selecting the heating temperature within a range of $-100°$ C. to $+100°$ C. of the temperature at which oxygen enter into the oxide superconductor, for example, between 350° and 400° C. for a thin film of $Y_1Ba_2Cu_3O_{7-x}$, oxygen atoms in the oxide superconductor do not move substantially and hence are not lost. Still more, photo-resist is removed by sublimation because the heat-treatment is carried out under ultra-high vacuum. Preferably, the final pressure in a vacuum chamber is reduced lower than $1\times10^{-9}$ Torr.

In the third embodiment of the process according to the present invention, photo-resist residue is not burnt but is sublimated so that oxide superconductor is not reduced and oxygen is not lost. From this fact, the superconducting properly is not deteriorated. Still more, in the process according to the present invention, photo-resist is not subjected to chemical treatment with chemicals so that the surface of the thin film of oxide superconductor is not deteriorated or contaminated and is not roughened.

The third embodiment of the process according to the present invention permits to remove photo-resist without spoiling the superconducting properties of thin film of oxide superconductor. This merit come from such a fact that the surface of thin film of oxide superconductor is neither contaminated nor roughened by the process according to the present invention.

BRIEF DESCRIPTION OF THE DRAWING

FIG. 1A shows a substrate 3 on which thin films are to be deposited successively by the process according to the present invention.

At first, a thin film of oxide superconductor (1) is deposited on the substrate (3) by off-axis sputtering method, laser abrasion method, reaction evaporation method, MBE or CVD technique.

Figure 1A:
FIGS. 1A, 1B, 1C and 1D illustrate successive steps for preparing a layered structure having at least one thin film of oxide superconductor by the first and second embodiments of the process according to the present invention.
Figure 1B:
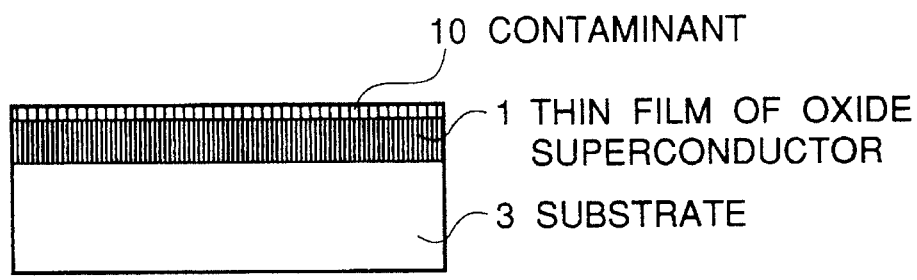

After deposition complete, the substrate (3) having the deposited thin film of oxide superconductor (1) is taken out of the sputtering chamber. A surface of the resulting thin film of oxide superconductor (1) has a deteriorated portion (10) thereon and is contaminated with hydrocarbons, $BaCO_3$, $BaCuO_2$ or the like caused by a reaction with moisture in air shown in FIG. 1B.

Then, the substrate (3) is placed in a ultra-high vacuum chamber which is then vacuumed lower than $1 \times 10^{-9}$ Torr. After that, the thin film of oxide superconductor (1) is heat-treated under operational conditions determined by the present invention. The surface of the thin film of oxide superconductor (1) is monitored by a quadruple mass spectrometer (QMS) and is analyzed by means of a low energy electron diffraction analyzer (LEED) or a X-ray photoelectron spectrometer (XPS) after the heat-treatment, in such a manner that contaminants are removed, deteriorated portion (10) disappears and a crystalline surface is exposed.

Figure 1C:
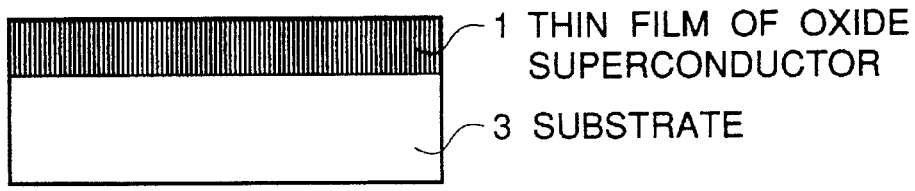
Figure 1D:
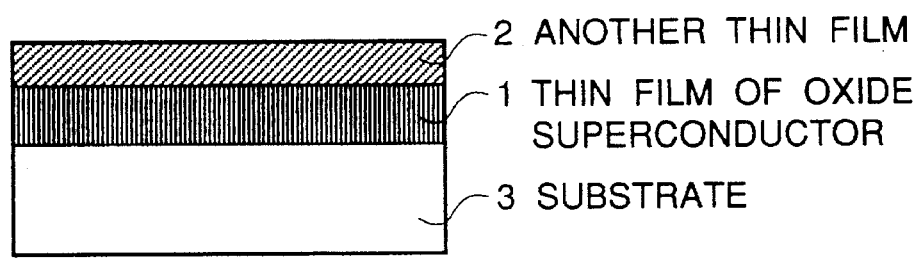

On the resulting cleaned surface (FIG. 1C), another thin film (2) (of oxide superconductor or of different material) is deposited in the same chamber by off-axis sputtering method, laser abrasion method, reaction evaporation method, MBE, CVD technique or the like.

The same procedure as above is adopted in the case of third embodiment in which the thin film of oxide superconductor has photo-resist residue in addition to the deteriorated portion (10).

DESCRIPTION OF THE PREFERRED EMBODIMENT

Now, the present invention will be described with referring to Examples but the scope of the invention should not be limited thereto.

EXAMPLE 1

In this Example 1, an a-axis oriented thin film of oxide superconductor of $Y_1Ba_2Cu_3O_{7-x}$ is deposited on a c-axis oriented thin film of oxide superconductor of $Y_1Ba_2Cu_3O_{7-x}$ by the process according to the present invention whose steps are illustrated in FIG. 1.

At first, a c-axis oriented thin film of oxide superconductor of $Y_1Ba_2Cu_3O_{7-x}$ (1) having a thickness of 300 nm is deposited on a substrate (3) of MgO (100) by off-axis sputtering method under following operational conditions:

| Sputtering gas Ar | 90% |
| --- | --- |
| $O_2$ | 10% |
| Pressure | 10 Pa |
| Substrate temperature | 700° C. |

After deposition complete, the substrate (3) is taken out of the sputtering chamber. A surface of the resulting thin film of oxide superconductor (1) has a deteriorated portion (10) thereon and is contaminated with hydrocarbons, $BaCO_3$, $BaCuO_2$ or the like caused by a reaction with moisture in air or the like.

Then, the substrate (3) is placed in a ultra-high vacuum chamber which is then vacuumed lower than $1 \times 10^{-9}$ Torr. After that, the heat-treatment of the thin film of oxide superconductor (1) is effected under following operational conditions:

| Pressure | lower than $1 \times 10^{-9}$ Torr |
| --- | --- |
| Heating temperature | 350 to 400° C. (substrate temperature) |
| Heating time | 10 min |

The surface of the thin film of oxide superconductor (1) is monitored by a quadruple mass spectrometer (QMS) and is analyzed by means of a low energy electron diffraction analyzer (LEED) or a X-ray photoelectron spectrometer (XPS) after the heat-treatment, in such a manner that contaminants are removed, deteriorated portion (10) disappears and a crystalline surface is exposed.

On the resulting cleaned surface (FIG. 1C), an a-axis oriented thin film of oxide superconductor of $Y_1Ba_2Cu_3O_{7-x}$ (2) having a thickness of 200 nm is deposited by off-axis sputtering method under following operational conditions:

| Sputtering gas Ar | 90% |
| --- | --- |
| $O_2$ | 10% |
| Pressure | 10 Pa |
| Substrate temperature | 600 to 650° C. |

In the layered thin films prepared by this Example 1, it is confirmed that both of the bottom superconductor layer and the top conductor layer possess improved crystallinity, continuity and good matching of lattices at an interface.

EXAMPLE 2

Example 1 is repeated except that a thin film of MgO of the same thickness is deposited on the c-axis oriented thin film of oxide superconductor of $Y_1Ba_2Cu_3O_{7-x}$ in place of the a-axis oriented thin film of oxide superconductor of $Y_1Ba_2Cu_3O_{7-x}$.

In this Example 2, a thin film of MgO (2) having a thickness of 200 nm is deposited by evaporation method under following operational conditions:

| Pressure | 10 Pa |
| --- | --- |
| Substrate temperature | 200° C. |

In the layered thin films prepared by Example 2 also, it is confirmed that both of the bottom superconductor layer and the MgO layer possess improved crystallinity and show a sharp boundary at an interface.

EXAMPLE 3

Example 2 is repeated except that the thin film of MgO is replaced by a thin film of Ag of the same thickness.

The thin film of Ag having a thickness of 200 nm is deposited by evaporation method under following operational conditions:

| Pressure | 10 Pa |
| --- | --- |
| Substrate temperature | 200° C. |

In the layered thin films prepared by Example 3 also, it is confirmed that both of the bottom superconductor layer and the Ag layer possess improved crystallinity and show good contact between two materials.

EXAMPLE 4

In this Example 4, thin film of oxide superconductor is patterned with photo-resist/etching technique and then, remaining photo-resist residue is removed by the process according to the present invention and by know method as following.

A thin film of oxide superconductor of $Y_1Ba_2Cu_3O_{7-x}$ deposited on a MgO substrate is used. This thin film of of $Y_1Ba_2Cu_3O_{7-x}$ possesses the initial values of the critical temperature (Tc) of 90 K. and the critical current density (Jc) at liquid nitrogen temperature of $3.2 \times 10^5$ A/cm$^2$.

A surface of this thin film of oxide superconductor of $Y_1Ba_2Cu_3P_{7-x}$ is cleaned and is coated with positive-type photo-resist of quinodiazido type. The photo-resist is pre-baked at 80° C. for one minute to be dried. The pre-baked photo-resist film is irradiated with light through a mask and then developed. Finally, photo-resist film is post-baked at 150° to 200° C. for one minute.

The, reactive ion etching is carried out onto the obtained patterned photo-resist layer so that the thin film of oxide superconductor is etched. The photo-resist is also etched during this etching operation of the thin film of oxide superconductor. Of course, portions of the thin film of oxide superconductor to be protected against etching must not be exposed. Remained photo-resist residue is removed after this etching operation as following.

In the process according to the present invention, the resulting substrate having a patterned thin film of oxide superconductor on which photo-resist is remained partly is placed in a vacuum chamber after the etching operation complete. The vacuum chamber is evacuated to a pressure of $1 \times 10^{-6}$ Torr and then heating of the substrate is initiated. The temperature of the substrate elevate up to 370° C. at the end of one hour heating. Photo-resist sublimate gradually. Evacuation of the vacuum chamber is continued to a pressure of $1 \times 10^{-10}$ Torr. At this pressure, heating is ceased and then the substrate is left to be cooled down to ambient temperature in the vacuum chamber.

For comparison, the remained photo-resist residue is burnt in oxygen plasma by the conventional ashing technique.

The superconducting properties of the thin films of oxide superconductor treated by the process of the present invention and by the prior art are determined to obtain following results:

|  | Critical temperature (K) | Critical current density (A/cm$^2$, 77 K) |
| --- | --- | --- |
| Initial value | 90 | $3.2 \times 10^5$ |
| Invention | 88 | $3.1 \times 10^5$ |
| Prior art | 42 | — |

The results reveal such a fact that the initial values of superconducting properties are substantially maintained in the case of the process according to the present invention but are seriously spoiled by the prior art. In other words, the process according to the present invention permits to remove photo-resist residue with minimum influence to the thin film of oxide superconductor.

We claim:

1. A process for removing contaminants from a surface of a film of oxide superconductor deposited on a substrate, characterized in that said film of oxide superconductor is heat-treated in ultra-high vacuum at a temperature which is within a range of −100° C. to +100° C. of the temperature at which oxygen enters into said oxide superconductor, and wherein said heat treatment is effected under a pressure of lower than $1 \times 10^{-9}$ Torr.

2. The process set forth in claim 1 wherein the heat-treatment is effected at a heating temperature between 350° and 400° C.

3. The process set forth in claim 1 wherein said process further comprises forming a layered structure, and further includes the step of depositing said thin film of oxide superconductor directly on a substrate as a bottom superconducting layer.

4. The process set forth in claim 3 wherein said bottom superconducting layer is a c-axis oriented thin film of $Y_1Ba_2Cu_3O_{7-x}$.

5. The process set forth in claim 1 wherein said contaminants are photo-resist residues remained on the surface of film of oxide superconductor.

6. The process set forth in claim 1 wherein said contaminants are those produced when the film of oxide superconductor is exposed to air.

7. A process for producing a layered structure containing at least one film of oxide superconductor having a contaminated surface on a substrate, characterized in that said contaminated surface of said film of oxide superconductor is heat-treated in ultra-high vacuum at a temperature which is within a range of −100° C. to +100° C. of the temperature at which oxygen enters into said oxide superconductor before another film is deposited on said film of oxide superconductor, and wherein the heat-treatment is effected under a pressure of lower than $1 \times 10^{-9}$ Torr.

8. The process set forth in claim 7 wherein the heat-treatment is effected at a heating temperature between 350° and 400° C.

9. The process set forth in claim 7 wherein said film of oxide superconductor is a bottom superconducting layer which is deposited directly on a surface of a substrate.

10. The process set forth in claim 9 wherein said bottom superconducting layer is a c-axis oriented film of $Y_1Ba_2Cu_3O_{7-x}$.

11. The process set forth in claim 7 wherein said another film also is made of oxide superconductor.

12. The process set forth in claim 11 wherein said another film is a c-axis oriented film of $Y_1Ba_2Cu_3O_{7-x}$.

13. The process set forth in claim 7 wherein said another film is made of non-superconductor.

14. The process set forth in claim 13 wherein said another film is a film of MgO or Ag.

15. A process for depositing, on a first film of oxide superconductor, a second film made of a material which is different from said oxide superconductor, characterized in that said first film of oxide superconductor is heat-treated under a pressure of lower than $1 \times 10^{-9}$ Torr at a temperature which is within a range of −100° C. to +100° C. of the temperature at which oxygen enter into said oxide superconductor before said second film is deposited.

16. A process for depositing a first film of an oxide superconductor and a second film of oxide superconductor successively, crystal orientation of said first film being different from that of said second film, characterized in that said first thin film is heat-treated under a pressure of lower than $1 \times 10^{-9}$ Torr at a temperature which is within a range of −100° C. to +100° C. of the temperature at which oxygen enter into said oxide superconductor and then said second film is deposited on said first thin film of an oxide superconductor.

17. A process for removing photo-resist from a film of oxide superconductor, characterized in that said film of oxide superconductor is heat-treated under a pressure of lower than $1 \times 10^{-9}$ Torr at a temperature which is within a range of −100° C. to +100° C. of the temperature at which oxygen enter into said oxide superconductor.

* * * * *

UNITED STATES PATENT AND TRADEMARK OFFICE
CERTIFICATE OF CORRECTION

| | | |
|---|---|---|
| PATENT NO. | : | 5,607,900 |
| DATED | : | Mar. 4, 1997 |
| INVENTOR(S) | : | Hiroshi INADA; Takao NAKAMURA; Michitomo IIAMA and So TANAKA |

It is certified that error appears in the above-indentified patent and that said Letters Patent is hereby corrected as shown below:

In Claim 16, line 5, "said first thin film" should be --said first film-- ;

In Claim 16, line 9, "said first thin film" should be --said first film-- ;

Signed and Sealed this

Third Day of June, 1997

Attest:

BRUCE LEHMAN

Attesting Officer

*Commissioner of Patents and Trademarks*